(12) United States Patent
Szczeszynski

(10) Patent No.: US 11,942,859 B2
(45) Date of Patent: *Mar. 26, 2024

(54) LEVEL SHIFTER FOR POWER APPLICATIONS

(71) Applicant: pSemi Corporation, San Diego, CA (US)

(72) Inventor: Gregory Szczeszynski, Hollis, NH (US)

(73) Assignee: pSemi Corporation, LLC, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/914,170

(22) Filed: Jun. 26, 2020

(65) Prior Publication Data

US 2021/0050774 A1 Feb. 18, 2021

Related U.S. Application Data

(63) Continuation of application No. 16/144,072, filed on Sep. 27, 2018, now Pat. No. 10,734,892.

(51) Int. Cl.
| | | |
|---|---|---|
| *H02M 3/07* | (2006.01) | |
| *H02M 1/088* | (2006.01) | |
| *H02M 3/158* | (2006.01) | |
| *H03K 19/0185* | (2006.01) | |

(52) U.S. Cl.
CPC ............. *H02M 3/07* (2013.01); *H02M 1/088* (2013.01); *H02M 3/1584* (2013.01); *H02M 3/1586* (2021.05); *H03K 19/018507* (2013.01)

(58) Field of Classification Search
CPC .......... H02M 1/08; H02M 1/088; H02M 3/07; H03K 19/018507
See application file for complete search history.

(56) References Cited

U.S. PATENT DOCUMENTS

| | | | | |
|---|---|---|---|---|
| 8,686,785 B2 * | 4/2014 | Koike | ................ | H03K 19/0944 326/62 |
| 2009/0002027 A1 * | 1/2009 | Lee | .................. | H03K 3/356113 326/80 |
| 2010/0109768 A1 * | 5/2010 | Kotowski | ............... | H03F 3/217 330/10 |
| 2010/0214014 A1 * | 8/2010 | Dennard | ................ | G11C 5/145 327/541 |
| 2013/0229841 A1 * | 9/2013 | Giuliano | ............. | H02M 1/4225 363/60 |
| 2014/0292392 A1 * | 10/2014 | Akahane | ................ | H03K 3/012 327/333 |
| 2016/0197614 A1 * | 7/2016 | Akahane | ........ | H03K 19/018528 327/109 |
| 2017/0187373 A1 * | 6/2017 | Bergogne | ................ | H02M 1/08 |

* cited by examiner

*Primary Examiner* — Harry R Behm

(74) *Attorney, Agent, or Firm* — Finnegan, Henderson, Farabow Garrett & Dunner LLP

(57) ABSTRACT

A level shifter causes a switch to open or close by selecting one of two stored logical values to generate a gate-drive voltage to cause a transition in the switch.

30 Claims, 4 Drawing Sheets

LEVEL SHIFTER FOR POWER APPLICATIONS

FIELD OF INVENTION

This invention relates to power converters, and in particular, to power converters that include switched-capacitor circuits.

BACKGROUND

Digital circuits rely heavily on having a constant source of voltage available. Unlike, for example, a flashlight that glows more dimly as battery voltage diminishes, a processor does not just slow down its processing when voltage diminishes. Once voltage is outside an acceptable range, it simply ceases to operate.

A power converter ensures the availability of a suitable voltage. Many power converters have switched-capacitor circuits or regulators that participate in maintaining a steady voltage. These circuits often rely on switches that open and close quickly and often.

A switch is often implemented as a MOSFET. A MOSFET has a channel that extends between a source and a drain. Assuming that a suitable voltage has been applied between the source and the drain, closing the switch causes current to flow through the channel between the source and the drain. Opening the switch halts this flow.

Opening and closing the switch involves controlling the properties of this channel. To close the switch, this channel must be made to support conduction. To open the switch, this channel must be made to inhibit conduction.

The transition between a channel that supports conduction and one that inhibits conduction is carried out by controlling a gate-drive voltage at a gate terminal of the MOSFET. To create a gate-drive voltage, charge is made to flow into the gate terminal so that it collects on a suitable surface and establishes an electric field in the channel. When the electric field is no longer needed, the charge is made to flow back out of the gate terminal. The presence or absence of this electric field is what opens and closes the switch.

The establishment of this electric field is not instantaneous. It takes some time for charge to flow into the gate. There is also a delay between the decision to change the state of the switch and the execution of that decision at the gate terminal.

For example, in order to change the state of a switch, a controller sends a signal to the switch. The signal makes its way through a switch driver, which then ultimately controls the voltage at the gate terminal. These delays place an upper limit on how fast the switch can be made to turn on and off. This upper limit, in turn, places limits on what the power converter can do.

SUMMARY

In one aspect, the invention features a level shifter that drives a switch. The switch has a gate that receives a gate-drive voltage that controls whether or not it is opened or closed. In response to an instruction that causes the switch to transition between being opened and being closed, the level shifter stores first and second logical values and selects one of the first and second logical values to generate the gate-drive voltage.

In some embodiments, the logical values are complementary to each other.

In other embodiments, the level shifter chooses the first logical value, inverts it, and then uses the now-inverted logical value to generate the gate-drive voltage.

In yet other embodiments, the level shifter includes a memory in which it stores the first and second values. This memory causes a delay between storage of the first value and storage of the second value.

Yet other embodiments feature a level shifter that includes first and second buffers and a multiplexer connected to the first and second buffers. The first and second buffers store the first and second logical values. The multiplexer selects whichever of the first and second logical values is derived from a fast bit and ignores whichever of the first and second logical values is derived from a slow bit.

Embodiments include those in which first logical value reaches a state in which it can be relied upon sooner than the second logical value reaches a state in which it can be relied upon. In these embodiments, the gate-voltage is derived from the first logical value.

A number of embodiments feature a level shifter having a memory that receives a signal. Among these are embodiments in which the memory includes first and second memory-cells. In such an embodiment, these memory cells are cross-coupled such that a change in a logical value stored in the first memory cell causes a change in a logical value stored in the second memory cell. Also among these embodiments are those in which the memory includes first and second memory-cells that are cross-coupled such that when a logical value is stored in the first memory-cell, the first memory-cell causes a complementary logical value to be stored in the second memory-cell.

Still other embodiments feature a level shifter having a delay. Among these are embodiments in which the delay prevents the gate-drive signal from being changed until lapse of a blanking interval. Also among these are embodiments that include, in addition to the delay, a first buffer, a second buffer, and a multiplexer. Among these embodiments, are those in which the first buffer receives the first logical value at a first time and the second buffer receives the second logical value at a second time that is later than the first time. The multiplexer selects the first logical value to derive the gate-drive signal. But the delay prevents the gate-drive signal from being changed until after the second time. Also among these embodiments are those in which the first buffer receives the first logical value at a first time and the second buffer receives the second logical value at a second time that is later than the first time. The multiplexer then selects the first logical value to derive the gate-drive signal. In these embodiments, the delay prevents the gate-drive signal from being changed until the lapse of a predefined period that follows the second time. This predefined period is long enough to permit transients to attenuate to a selected level.

Among the embodiments are those in which the switch is part of a regulator. Yet other embodiments are those in which the switch is part of a switching network.

Yet other embodiments include a latch. Among these are embodiments in which the latch stores information indicative which of the first and second logical values is to be selected to generate the gate-drive voltage. Also among these embodiments are those in which the latch stores information indicative a preceding transition of the switch. Also among these embodiments are those in which the latch stores the gate-drive signal prior to releasing the gate-drive signal to the gate.

Additional embodiments feature an input interface and an output interface. The input interface receives the instruction and communicates the instruction to the level shifter. The output interface receives a gate-drive signal from the level shifter and derives, therefrom, a gate-drive voltage to be applied to the gate. The input interface connects between a first low potential and a first high potential. Meanwhile, the output interface connects between a second low potential and a second high potential. The second low potential floats relative to the first low potential.

Also among the embodiments are those in which an output interface receives the gate-drive signal from the level shifter and derives, from the gate-drive signal, a gate-drive voltage to be applied to the gate. In these embodiments, a variable potential difference exists across the output interface.

In some embodiments, the level shifter includes first and second buffers that store corresponding first and second logical values. The first buffer connects to a non-inverting input of a multiplexer and the second buffer connects to an inverting input of the multiplexer. Among these are embodiments in which inverters implement the first and second buffers.

In still other embodiments, there exists a memory having a first memory-cell and a second memory-cell. The memory is configured such that pulling down a voltage to begin changing a state of the first memory cell causes a voltage at the second memory-cell to begin rising, thereby beginning a change in state of the second memory-cell. The change in state of the second memory-cell completes only after the change in state in the first memory-cell has completed.

Some embodiments further include a power converter configured to transform a voltage at a first terminal thereof into a voltage at a second terminal thereof. The power converter includes a switching network that, during operation, arranges capacitors into a first capacitor network and later rearranges the capacitors into a second capacitor network. The power converter also includes a regulator that connects to the switching network. This regulator generates a field having an amplitude that depends at least in part on an extent to which a rate at which charge enters the regulator changes with time. Either the switching network or the regulator includes the switch. In these embodiments, the power converter includes the level shifter.

In another aspect, the invention features a power converter having a first terminal and a second terminal. The power converter transforms a voltage at the first terminal into a voltage at the second terminal. Within the power converter is a switching network that, when connected to capacitors, arranges the capacitors into a first capacitor network and then rearranges them into a second capacitor network. A regulator connects to the switching network and generates a field having an amplitude that depends at least in part on an extent to which a rate at which charge enters the regulator changes with time.

Either the switching network or the regulator includes a switch that transitions between first and second states in response to a gate voltage across a gate thereof and a level shifter that includes a memory and a multiplexer. This level shifter participates in the transition of the switch between states.

The level shifter's memory stores complementary first and values. In response to an instruction to cause a transition from one switch state to another, the multiplexer chooses one of the two values to derive a gate-drive signal. It is this gate-drive signal that will ultimately cause the desired transition.

In some embodiments, the multiplexer derives the gate-drive signal from the incorrect value when the first state is a conducting state. In others, it derives the gate-drive signal from the incorrect value when the first state is a non-conducting state.

In some embodiments, the multiplexer is configured to choose whether to derive the gate-drive signal from the correct value or from the incorrect value based on whether the second state is a conducting state of the switch or a non-conducting state of the switch.

Among the embodiments are those in which the memory responds to the instruction to cause a transition by replacing the correct value with a new correct value and also replacing the incorrect value with a new incorrect value. In such embodiments, the multiplexer derives the gate-drive signal from the incorrect value when the time it takes to replace the incorrect value is less than the time it takes to replace the correct value.

Also among the embodiments are those in which the memory responds to the instruction to cause a transition by replacing the correct value with a new correct value and also replacing the incorrect value with a new incorrect value. In such embodiments, the multiplexer derives the gate-drive signal from the incorrect value in those cases in which the replacement of the incorrect value is complete before the replacement of the correct value has had time to complete.

Other embodiments include preventing the gate-drive signal from being provided to an output interface that connects to the gate and then, after having done so, releasing the gate-drive signal to the output interface.

Still other embodiments feature a latch that stores information indicative of the memory's state. The multiplexer chooses whether to derive the gate-drive signal from the correct value or from the incorrect value based on the information that has been stored in the latch.

Still other embodiments feature a latch in which the multiplexer stores the gate-drive signal for application to the gate.

In yet other embodiments, the memory includes a first first memory-cell that stores a binary digit and a second memory-cell that stores the complement of the binary digit.

In some embodiments, the memory responds to an instruction to cause a memory transition by complementing the and first second binary digits stored therein. In other words, if the memory is storing (0,1) it transitions into storing (1,0) and if the memory is storing (1,0) it transitions into storing (0,1). The time it takes to complement the binary digits, however, is not the same. Accordingly, the task of complementing the first binary digit may complete before the task of complementing the second binary digit, or vice versa. In these embodiments, the selector derives the gate-drive signal from whichever task is completed first.

Other embodiments include a memory having a pair of memory cells that are coupled to each other such that a change in state to one memory cell results in a change in state to the other memory cell.

In some embodiments, the multiplexer includes an inverting input and a non-inverting input.

Still other embodiments include an input interface that receives the instruction to cause the transition and communicates it to the level shifter. In response to receiving the instruction, the input interface provides the memory with first and memory signals that cause complementary state transitions in the memory.

Further embodiments include those in which the switch is a constituent of the regulator and those in which the switch is a constituent of the switching network.

In other embodiments, the acts of first memory-cell's state and changing the second memory-cell's state are coupled. In these embodiments, changing the first memory-cell's state includes causing charge to decrease in potential energy and changing the second memory-cell's state includes causing charge to increase in potential energy. In these embodiments, the multiplexer derives a gate-drive signal based on a value stored in the first memory-cell.

Other embodiments include an input interface and an output interface. The input interface receives instructions and communicates the instructions to the level shifter. The output interface receives a gate-drive signal from the level shifter and derives, therefrom, a gate-voltage to be applied to the gate. In some of these embodiments, the input interface connects between a first low potential and a first high potential and the output interface connects between a second low potential and a second high potential. In these embodiments, the second low potential floats relative to the first low potential.

In other embodiments, the level shifter includes an output interface that provides a gate-voltage to the gate notwithstanding a variable potential difference across the output interface.

In still other embodiments, when the multiplexer derives the gate voltage from the incorrect value, it also corrects the incorrect value to match the correct value.

These and other features of the invention will be apparent from the following detailed description and the accompanying figures, in which

DETAILED DESCRIPTION

Figure 1:
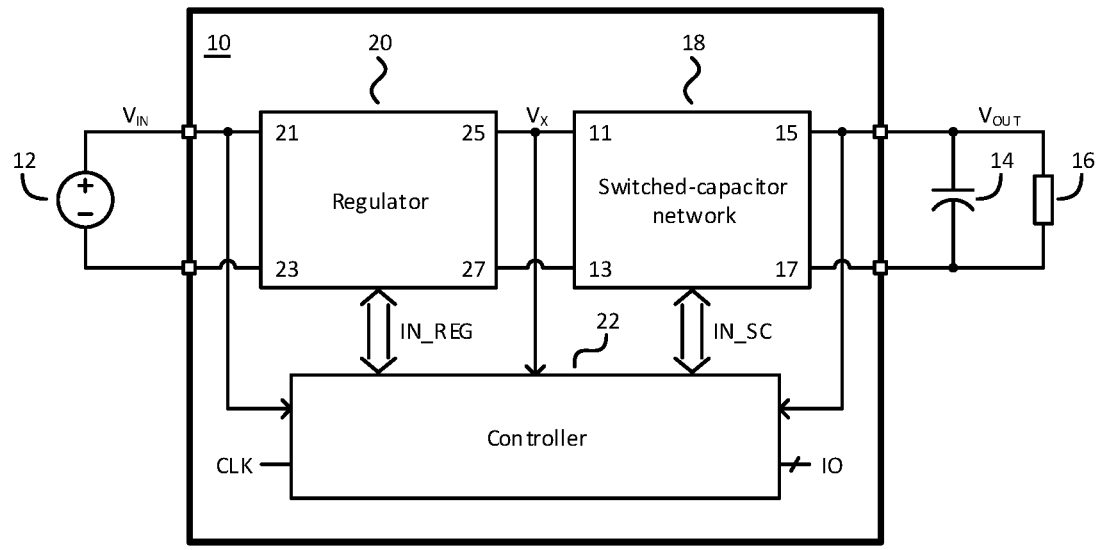
FIG. 1 shows a power converter having a switched capacitor network.

FIG. 1 shows a power converter 10 that receives an input voltage VIN provided by a voltage source 12, transforms it into an output voltage VOUT. The power converter 10 then makes the output voltage VOUT available at an output capacitor 14 across which is connected a load 16. The power converter 10 can be a step-up converter, in which case the output voltage VOUT exceeds the input voltage VIN, or a step-down converter, in which the converse is true.

The power converter 10 includes a switched-capacitor network 18 and a regulator 20.

The switched-capacitor network 18 features first and second terminals 11, 13 that connect to first and second regulator terminals 25, 27. It also includes third and fourth terminals 15, 17 that connect across the output capacitor 14. The regulator 20 includes third and fourth regulator terminals 21, 23 that connect across the voltage source 12.

A controller 22 controls the various switches in both the switched-capacitor network 18 and the regulator 20 to cause the switched-capacitor network 18 and the regulator 20 to cooperate to cause a voltage transformation between the input voltage VIN and the output voltage VOUT. The controller 22 does so by generating control signals based on various feedback signals. First and second links IN_REG, IN_SC allow the controller 22 to communicate with the regulator 20 and the switched-capacitor network 18 respectively both to provide control signals to the switched-capacitor network 18 and the regulator 20 and to receive feedback signals from the switched-capacitor network 18 and the regulator 20. A clock port CLK provides the controller 22 with a clock signal that the controller 22 uses to determine when to provide its control signals to the switched-capacitor network 18 and the regulator 20. An I/O port I/O provides a way to communicate with the controller 22 from outside the power converter 10.

The regulator 20 can include a component that generates an electric field whose amplitude depends at least in part on the rate at which current through the regulator changes with time. A suitable component with this property is an inductor.

Power converters of the type shown in FIG. 1 are described in detail in U.S. Pat. Nos. 8,860,396, 8,743,553, 8,723,491, 8,503,203, 8,693,224, 8,724,353, 8,619,445, 9,203,299, 9,742,266, 9,041,459, U.S. Publication No. 2017/0085172, U.S. Pat. Nos. 9,887,622, 9,882,471, PCT Publication No. WO2017161368, PCT Publication No. WO2017/091696, PCT Publication No. WO2017/143044, PCT Publication No. WO2017/160821, PCT Publication No. WO2017/156532, PCT Publication No. WO2017/196826, and U.S. Publication No. 2017/0244318, the contents of which are all incorporated herein by reference.

Figure 2:
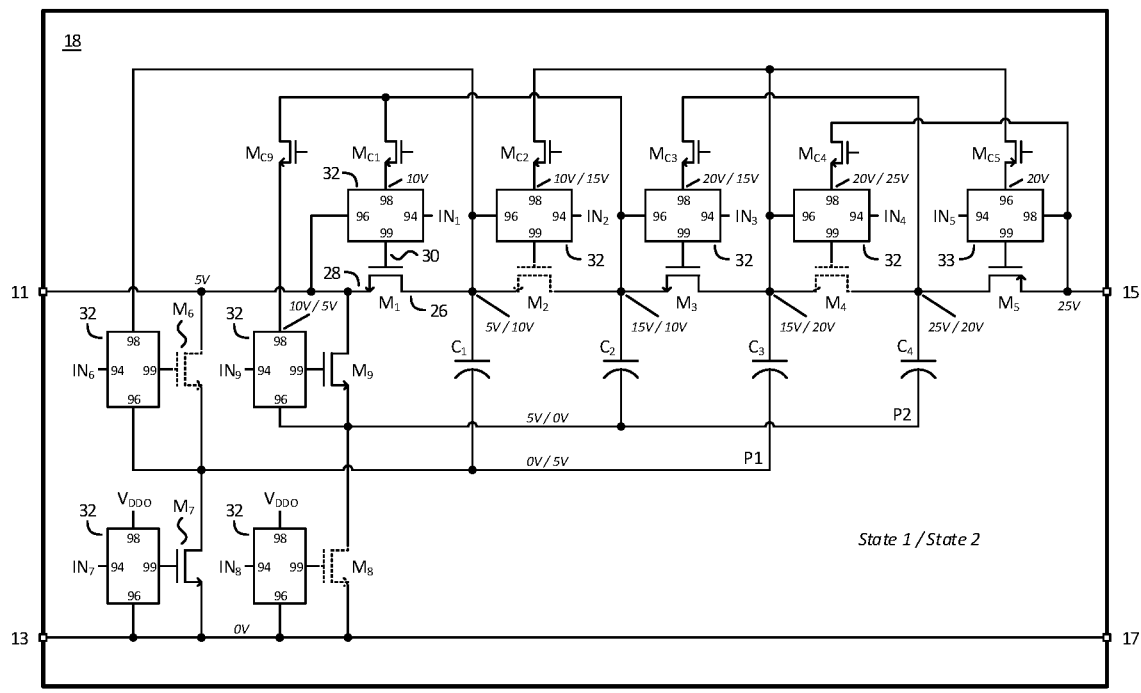
FIG. 2 shows details of the switched capacitor network shown in FIG. 1.

FIG. 2 shows one of many topologies for the switched-capacitor network 18 shown in FIG. 1.

In the particular topology shown in FIG. 2, a switched-capacitor network 18 has switches M1-M9 that open and close. The switches divide into two groups, with switches in a particular group opening and closing together. The first group consists of the odd-numbered switches M1, M3, M5, M7, M9 and the second group consists of the even-numbered switches M2, M4, M6, M8. The controller 22 controls which switches open, when they open, which switches close, and when they close. It does so by providing instruction signals IN1-IN9 along the second link IN_SC, which is shown in FIG. 1.

The switches M1-M9 are implemented as MOSFETs, each of which has a drain 26, a source 28, and a gate 30. All but the fifth switch M5 are n-channel MOSFETs. The fifth switch M5 is a p-channel MOSFET. In operation, the source 28 is at a source voltage and the drain 26 is at a drain voltage that is close to but slightly higher than the source voltage if a n-channel device. The region between the drain 26 and the source 28 is referred to herein as the "channel." The channel can be in a conducting state or a non-conducting state. When the channel is in a conducting state, the switch is said to be "closed." Otherwise, the switch is said to be "open."

To close one of the switches M1-M9, either an NMOS driver 32 or a PMOS driver 33 places a gate-drive voltage at the gate 30. This gate-drive voltage causes an electric field that is strong enough to cause the channel to transition into a conducting state. To ensure that this is the case, the gate-drive voltage is at some offset from the source voltage. Depending on the topology of the circuit, the source voltage either remains constant during operation or floats during operation.

Each driver 32, 33 includes four ports: a gate-drive port 99 that connects to the gate 30, a control port 94 that receives instruction signals IN1-IN9 from the controller 22, and first and second power terminals 96, 98 across which a voltage difference is maintained so that each driver 32, 33 will be able to push the requisite charge through the gate-drive port 99 and into the gate 30.

For some switches M7, M8, the driver's first and second power terminals 96, 98 connect between a voltage source VDD and ground. However, other switches M1, M2, M3, M4, M5, M6, M9 have drivers whose first and second power terminals 96, 98 connect to other nodes within the switched-capacitor network. Some of these drivers have a power terminal 96, 98 that is connected to a cascoded transistor MC1, MC2, MC3, MC4, MC5, MC9.

For some of those switches M2, M3, M4, M6, M9 whose drivers connect to other nodes within the switched-capacitor network, it is possible that the voltages at the first and second power terminals 96, 98 will be floating voltages. This means that the source voltage does not stay the same during the course of operation. The NMOS driver 32 must therefore apply a gate-drive voltage that is offset from a moving target, namely the floating source-voltage.

Figure 3:
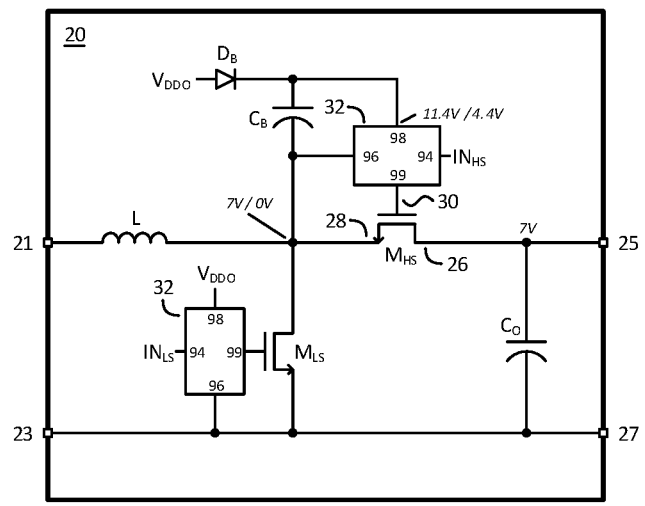
FIGS. 3-4 show details of the regulators shown in FIG. 1.
Figure 4:
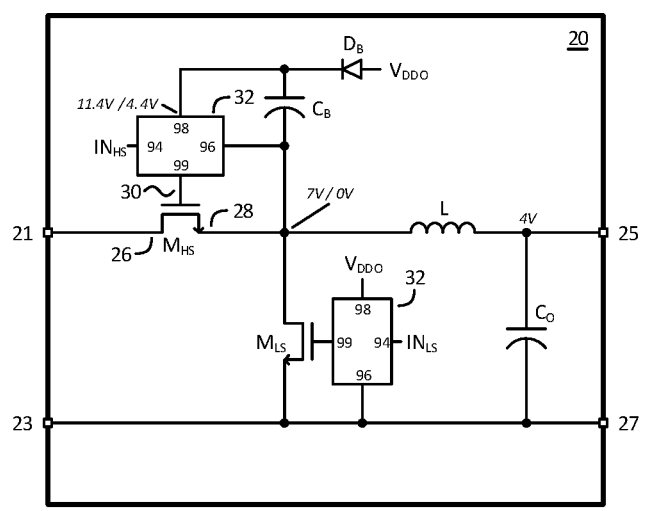

The difficulty arising from a floating source-voltage is seen clearly in FIGS. 3 and 4, which show particular implementations of the regulator 20 shown in FIG. 1.

The regulator 20 shown in FIG. 3 is a boost converter that outputs a voltage of seven volts. The boost converter features a central node that connects to an inductor L, a low-side switch MLS and a high side-switch MHS having a source 28, a drain 28, and a gate 30. A low-side NMOS driver 32 drives the low-side switch MLS and a high-side NMOS driver 32 drives the high-side switch MHS.

Each NMOS driver 32 has first and second power terminals 96, 98. The voltage that is present across the first and second power terminals 96, 98 governs the voltage that is placed at the gate terminal of the transistor being driven. It is therefore quite important that the correct voltage difference exist between the first and second power terminals 96, 98.

For the low-side switch MLS, the voltage applied to the driver's second terminal 98 is a constant voltage VDDO. While for the high-side switch MHS, the voltage applied to the driver's second terminal 98 is a floating voltage.

In the case of the NMOS driver 32 for the low-side switch MLS, the first power terminal 96 connects to ground. This means that the voltage difference across the first and second power terminals 96, 98 is simply the constant voltage VDDO.

In the case of the NMOS driver 32 for the high-side switch MHS, the first power terminal 96 connects to the central node. The voltage at the central node alternates between 7 volts and 0 volts (assuming the output voltage is 7 volts). When the central node is at 0 volts, the diode DB conducts, thus allowing charge to flow into the capacitor CB until the voltage across the capacitor CB rises to VDDO minus the forward voltage of the diode DB. Assuming a nominal value of VDDO at 5 volts and a forward voltage of 0.6 volts, the voltage difference between the first and second power terminals 96, 98 will be approximately 4.4 volts.

Since the source-voltage of the high-side switch MHS is moving around, it difficult to apply the correct voltage to the gate 30 of the high-side switch MHS. A similar difficulty is apparent in the buck converter shown in FIG. 4, in which the voltage at a central node likewise alternates between 7 volts and 0 volts (assuming its input voltage is 7 volts).

As was the case for the switched-capacitor network 18 shown in FIG. 2, the controller 22 controls the opening and closing of the regulator's high-side switch MHS and its low-side switch MLS. The controller 22 does so by providing instruction signals INHS-INLS along the first link IN_REG, which is shown in FIG. 1.

The NMOS drivers 32 shown in the switched-capacitor network 18 in FIG. 2 and those in the regulator 20 in FIGS. 3-4 operate in a similar manner. Thus, only a representative NMOS driver 32, namely the one associated with the first switch M1 in FIG. 2, will be discussed in detail.

The representative NMOS driver 32 that drives the first switch M1 receives a first instruction signal IN1. This first instruction signal IN1 is a digital signal that can have any value of voltage. In particular, the first instruction signal IN1, which tells the NMOS driver 32 to open or close the first switch M1, does not have to have a voltage that corresponds to that which is actually required to open or close the first switch M1. The role of the NMOS driver 32 is, in part, to translate the first instruction signal IN1 provided by the controller 22 into a gate-drive signal having a voltage that is actually capable of controlling the first switch M1.

Figure 5:
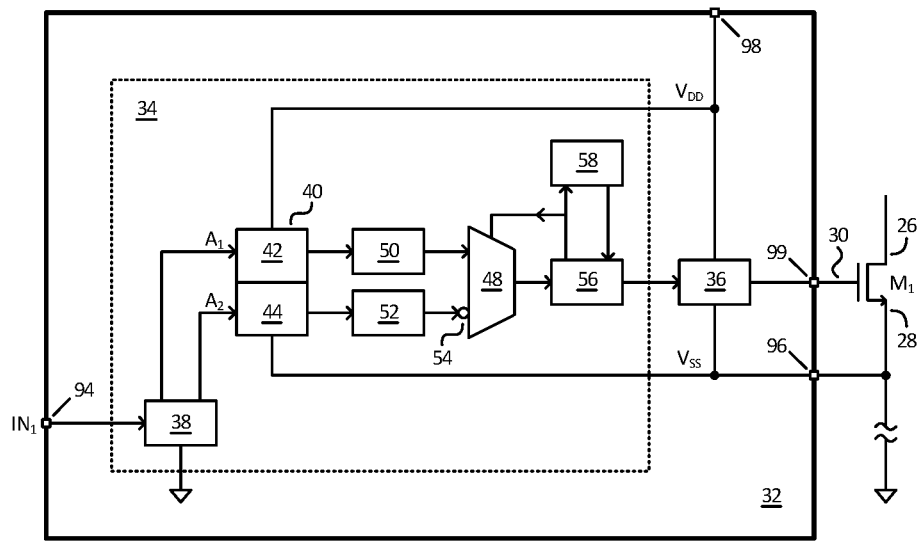
FIG. 5 shows details of a gate driver for driving one of the switches shown in FIGS. 2-4.

To translate between the voltage of the first instruction signal IN1 and that of the gate-drive signals, the NMOS driver 32 features a level shifter 34 to which an output interface 36 connects, as shown in FIG. 5.

The first instruction signal IN1, which the level shifter 34 receives from the controller 22, transitions between a first pair of voltages. The gate-drive signal, which is what the level shifter 34 ultimately provides to the first switch M1, transitions between a second pair of voltages.

The first and second pairs of voltages can differ from each other in both spread and offset. The "spread" refers to the voltage difference between the two voltages. The "offset" refers to the value of these voltages relative to some fixed reference value. This offset can therefore be viewed as a DC offset.

However, although the gate-drive signal and the first instruction signal IN1 may have different offsets and spreads, they should have the same pulse width. Thus, when the first instruction signal IN1 transitions between its two voltages, the gate-drive signal should also transition between its two voltages. This means that the leading and trailing edges of the first instruction signal IN1 and those of the gate-drive signal should come as closely as possible to being temporally aligned.

In general, there will be a delay associated with any transition between two voltages. This delay arises simply because the charge carriers within the actual devices that comprise the circuit need time to rearrange themselves within a material in which they have only a finite mobility. Thus, a delay between the leading edges of the first instruction signal IN1 and the gate-drive signal is inevitable. Similarly, a delay between the trailing edges of the instruction and gate-drive signals is also inevitable. However, as long as the delay between the two leading edges matches that for the two trailing edges, the pulse width will stay the same.

Unfortunately, in practical devices, the delay between the two leading edges and that between the two trailing edges may not be the same. This means that the pulse width of the gate-drive signal may not exactly match the pulse width of the first instruction signal IN1. The illustrated level shifter 34 avoids this difficulty.

As shown in FIG. 5, the output interface 36 connects between a supply voltage $V_{DD}$ and the floating voltage $V_{SS}$. The switch's source 28 connects to the floating voltage $V_{SS}$. FIG. 5 only shows the first switch M1. However, the remaining switches M2-M9, MHS, MLS are driven in a similar manner.

The gate 30 receives its gate-drive voltage from the output interface 36. The value of the gate-drive voltage depends at least in part on a gate-drive signal provided by the level shifter 34 to which the output interface 36 connects.

To change the state of the first switch M1, the controller 22 sends a first instruction signal IN1 to an input interface 38. The first instruction signal IN1 controls the state of the first switch M1.

A memory unit 40 includes first and second memory-cells 42, 44 that are cross-coupled to each other. As a result, a change in the state of the first memory-cell 42 will cause a change in the state of the second memory-cell 44.

In response to receiving the first instruction signal IN1, the input interface 38 provides first and second memory signals A1, A2 that control the states of the first and second memory-cells 42, 44 respectively. Thus, a transition in the first memory signal A1 will cause a change in the state of the first memory-cell 42. The change in the first memory-cell 42 will then trigger a change in the second memory-cell 44. Conversely, a transition in the second memory-signal A2 will cause a change in the state of the second memory cell 44. This change in state of the second memory-cell 44 will then cause a change in the state of the first memory-cell 42.

The first and second memory-cells 42, 44 are cross-coupled in such a way that when the first memory signal A1 causes the first memory-cell 42 to transition into a state in which it stores a logical "0," it causes the second memory-cell 44 to transition into a state in which it stores a logical "1." Conversely, when the second memory signal A2 causes the second memory-cell 44 to transition into a stage in which it stores a logical "0," the second memory-cell 44 will cause the first memory-cell 42 to transition into a state in which it stores a logical "1." As a result, when the dust settles and the memory unit 40 has stabilized, the first and second memory-cells 42, 44 will be storing complementary logical values.

In principle, it would appear unnecessary to have two memory signals A1, A2. After all, if one memory cell controls the other, one could just have the first memory signal A1 to toggle the first memory-cell 42 and then just rely on the first memory-cell 42 to toggle the second memory-cell 44. It would also seem unnecessary to have two memory cells 42, 44 at all. After all, if the memory unit 40 is intended to store a value used to drive the first switch M1, only one value should be needed, not two values, particularly when the values are not even the same.

The values stored by the first and second memory cells 42, 44 are stored in corresponding first and second buffers 50, 52 and made available to corresponding first and second inputs of a multiplexer 48. In the embodiment shown, the first and second buffers 50, 52 are implemented as inverters.

The multiplexer 48 will ultimately choose which of the two values will be used to drive the first switch M1. Because the values stored in the first and second buffers 50, 52 are logical complements of each other, the second input includes an inverter 54 so that the multiplexer 48 will be forced to choose between two identical logical values.

Neither of the foregoing processes occurs instantaneously. Between the time that the first and second memory signals A1, A2 cause a transition in the first and second memory-cells 42, 44 and the time that the bits stored in the first and second buffers 50, 52 can be relied upon, some time elapses. This elapsed time will be referred to herein as a "transition delay."

A difficulty that arises is that the value stored in one buffer 50, 52 will be ready for use before the value stored in the other buffer 52, 50. This bit, which is the first bit that can be relied upon, will be referred to herein as "the fast bit." Its companion bit, which is in the other buffer and which requires slightly longer before it too can be relied upon, will be referred to herein as the "slow bit." The transition that led to the fast bit will be referred to herein as the "fast transition" and the transition that led to the slow bit will be referred to herein as the "slow transition."

A significant reason for having two different transition delays arises from the fact that the two memory cells 42, 44 do not change state equally fast. When the first memory signal A1 causes a transition in the first memory-cell 42, the first memory-cell 42 will change state more quickly than the second memory-cell 44. This means that the first buffer 50 will store the fast bit and the second buffer 52 will store the slow bit. Conversely, when the second memory signal A2 causes a transition in the second memory-cell 44, the second memory-cell 44 will change state more quickly than the first memory-cell 42. Therefore, the second buffer 52 will now be the one that stores the fast bit and the first buffer 50 will store the slow bit.

The result of having first and second memory cells 42, 44 is therefore the assurance that there will always be a fast transition with a known delay and there will always be a slow transition with a known, albeit longer, delay. By consistently choosing only the fast bit or only the slow bit, it is possible to ensure that the delay associated with the state transition will always be the same. This means that the pulse width of the gate-drive signal will match the pulse width of the instruction signal.

However, this creates a new difficulty.

For example, suppose that the multiplexer 48 is configured to always rely on the fast bit and ignore the slow bit. The multiplexer 48 would have to choose between the first and second buffer 50, 52. However, sometimes the fast bit will be in the first buffer 50 and sometimes it will be in the second buffer 52.

The multiplexer 48 thus finds itself playing a shell game. Sometimes the fast bit will be in the first buffer 50 and sometimes the fast bit will be in the second buffer 52. However, the multiplexer 48 does not know where it is.

To determine which buffer 50, 52 is holding the fast bit, the multiplexer inspects a latch 56. The latch 56 stores the most recent state of the memory unit 40.

If the latch 56 indicates that the first memory-cell 42 was most recently in a first state, the multiplexer 48 will know that the fast bit is the one stored in the first buffer 50. If the latch 56 indicates that the first memory-cell 42 was most recently in a second state, the multiplexer 48 will know that the fast bit is the one stored in the second buffer 52. This provides a way for the multiplexer 48 to always choose the fast bit. In either case, the result is a gate-drive signal that is derived from a bit that sustains the same delay each time. This means that the delay between the leading edge of the gate-drive signal and the leading edge of the instruction signal will be the same as the delay between the trailing edge of the gate-drive signal and the trailing edge of the instruction signal. As a result, the gate-drive signal and the instruction signal will have the same pulse widths. This gate-drive signal ultimately reaches the output interface 36, which transforms it into an appropriate gate-drive voltage to be provided to the transistor's gate.

However, even if the multiplexer 48 knows which buffer 50, 52 is holding the fast bit, it still does not know if the fast bit has stabilized enough to be relied upon.

Many electrical phenomena can disturb the value of a bit that has been stored in the buffer 50, 52. For example, whenever a sudden transition occurs in any electrical system, there will be some ringing that must die down. This ringing can easily flip the bit stored in a buffer 50, 52 several times before it has died down enough to make it possible to rely on its value. In those cases where the fast bit is to be relied upon, there may be a disturbance sufficient to flip the fast bit. Thus, it is not enough to simply identify which buffer 50, 52 holds the fast bit. In addition, it is important to add a blanking period after the gate-drive signal transition. To address the foregoing difficulties, the level shifter 34 also includes a delay 58 that holds the gate-drive signal for a blanking interval. This blanking interval prevents the gate-drive signal from changing during this time. The blanking interval begins with the selection of the fast bit and lasts at least long enough so that, by the time the blanking interval has finished, the slow bit will already have been presented to the multiplexer 48.

Like any fast transition, the transition between states causes the transients to affect the values of the bits stored in the first and second buffers 50, 52. In some embodiments, the blanking interval lasts long enough so that, by the time the blanking interval has finished, these transients will have attenuated to the point where they will no longer cause spurious transitions in the state of the first switch M1.

Figure 6:
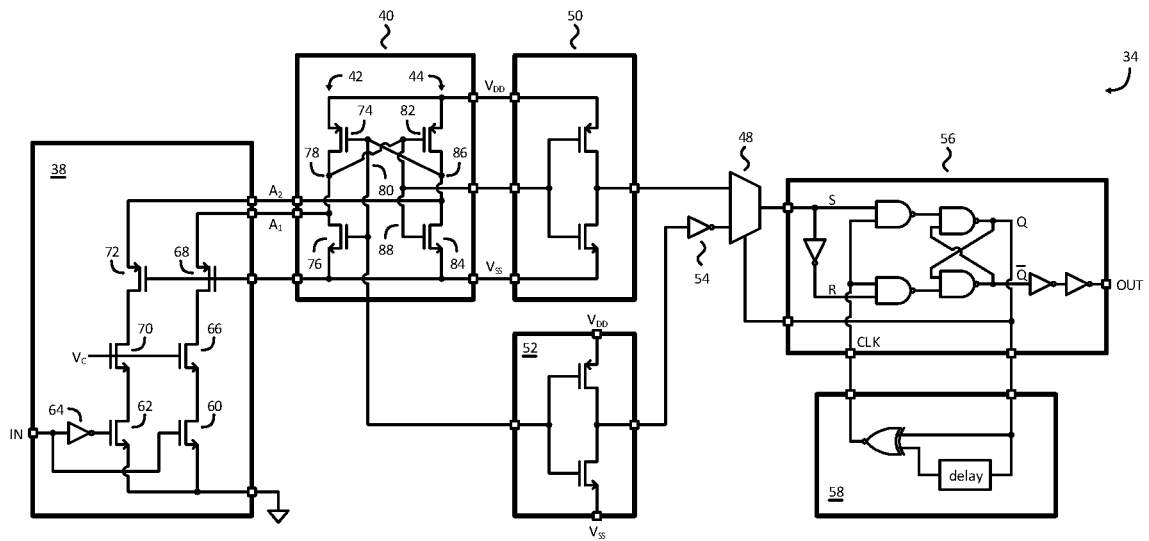
FIG. 6 shows the circuitry within the various gate driver modules shown in FIG. 5.

FIG. 6 shows further details of the NMOS driver 32 shown in FIG. 5.

The input interface 38 features first and second input-interface transistors 60, 62 having grounded sources. An inverter 64 complements any voltage applied to the second input-interface transistor's gate.

The first input-interface transistor's drain connects to those of a first pair of cascoded power transistors 66, 68. The second transistor's drain connects to those of a second pair of cascoded power transistors 70, 72. It is these power transistors 66, 68, 70, 72 that sustain the highest voltages across their respective channels when opened.

The first pair of cascoded power transistors 66, 68 ultimately provides the first memory signal A1. The second pair of cascoded power transistors 62, 72 ultimately provides the second memory signal A2. Because of the inverter 64, the first and second input-interface transistors 60, 62 are always in opposite states. As such, the first and second memory signals A1, A2 are also in opposite states.

The memory unit 40 features first and second memory-transistors 74, 76 that define the first memory-cell 42. As is apparent from the figure, the first memory-transistor 74 is a PMOS transistor and the second memory-transistor 76 is an NMOS transistor. The drains of the first and second memory-transistors 74, 76 connect to define a first node 78. The gates of the first and second memory-transistors 74, 76 connect to define a second node 80.

The memory unit 40 also features third and fourth memory-transistors 82, 84 that define the second memory-cell 44. The drains of the third and fourth memory-transistors 82, 84 connect to define a third node 86. The gates of the third and fourth memory-transistors 82, 84 connect to define a fourth node 88. As is also apparent from the figure, the third memory-transistor 82 is a PMOS and the fourth memory-transistor 84 is an NMOS.

The input interface 38 applies the first memory signal A1 to the first node 78 and the second memory signal A2 to the third node 86. The first and second buffers 50, 52 determine what bit is stored in the first and second memory-cells 42, 44 by inspecting the voltage at the second and fourth nodes 80, 88. The first node 78 connects to the fourth node 88. The third node 86 connects to the first node 80. These connections cross-couple the first and second memory-cells 42, 44.

As a result of the foregoing configuration, the first and second memory-cells 42, 44 change state in opposite directions. As the first memory-cell 42 transitions from a higher voltage to a lower voltage, the second memory-cell 44 transitions from a lower voltage to a higher voltage and vice versa.

It can be seen from FIG. 6 that a low voltage of the first memory signal A1 pulls the first node 78 to this low voltage. Because the first node 78 is coupled to the gate of the third memory-transistor 82, the third node 86 transitions into a high voltage. This transition of the third node 86 takes more time than the transition of the first node 78. As a result, the bit represented by the voltage at the third node 86 becomes the slow bit and the bit represented by the first node 78 becomes the fast bit.

A low voltage of the second memory signal A2 has the opposite effect, resulting in a slow bit at the first node 78 and a fast bit at the third node 86.

As shown in FIG. 6, the latch 56 is an SR latch that serves two functions.

Prior to the memory transition, the latch 56 stores the value of the most recently read fast bit. This provides the a priori knowledge that the multiplexer 48 needs to know which of the first and second buffers 50, 52 holds the new fast bit. Then, after the multiplexer 48 has read the new fast bit from the appropriate one of the first and second buffers 50, 52, the latch 56 locks the value of the new fast bit.

This is useful for two reasons. First, it provides the a priori knowledge that will be needed for the next transition. And second, it means that the gate-drive signal can be held constant during the blanking interval.

The ability to hold the gate-drive signal constant is useful for two reasons.

First, after having selected the fast bit, there is still the arrival of the slow bit to contend with. There remains the possibility that the arrival of the slow bit will disturb the gate-drive signal. For this reason, it is preferable to hold the gate-drive signal constant for a first delay time that is at least as long as it takes for the slow bit to arrive.

Secondly, transients occur as a result of the level shifter 34 having changed states. In particular, the large voltage swings sustained by the cascoded transistors 66, 68, 70, 72 is such that the parasitic effects associated with the cascoded transistors 66, 68, 70, 72 can cause transients that are large enough to briefly disturb the memory unit 40. As a result, the memory unit 40 may transition unpredictably between two states for a brief period until the transients have settled. If the switch's gate 30 is connected during this period, the first switch M1 may randomly transition between conducting and non-conducting states. This would impede correct operation. It is therefore useful, after the lapse of the first delay time, to continue to hold the gate-drive signal constant for a second delay time that is long enough to allow any such transients to die away.

In the illustrated embodiment, the delay 58 features a blanking generator that holds the gate-drive signal for a blanking interval. In some embodiments, the blanking interval corresponds to the first delay time only. In other embodiments, the blanking interval is at least the sum of the first and second delay times. In the particular embodiment shown, the blanking generator holds the gate-gate-drive signal for a ten-nanosecond blanking interval before releasing it to the switch's gate 30. This promotes application of a stable gate voltage to the switch.

Figure 7:
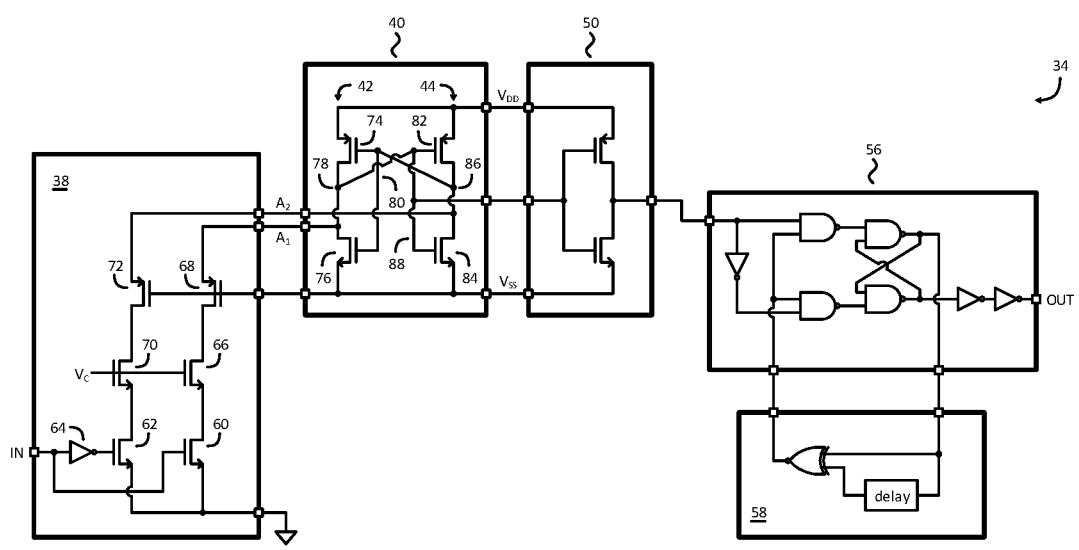
FIG. 7 shows circuitry similar to that shown in FIG. 6 but that avoids having a multiplexer.

In an alternative embodiment, shown in FIG. 7, there is only a single buffer 50. In this case, the multiplexer 48 can be dispensed with because there is only one buffer 50 to choose from. In this case, the delay 58 causes a blanking interval that is long enough for transients to die down so that the value stored in the first buffer 50 can be relied upon.

The level shifter has been described as being used with a first switch M1 in the switched-capacitor network 18. However, there is no reason it cannot be used to drive other switches, such as a switch within the regulator 20.

Generally speaking, a non-abstract computer accessible storage medium may include any non-transitory storage media accessible by a computer during use to provide instructions and/or data to the computer. For example, a computer accessible storage medium may include storage media such as magnetic or optical disks and semiconductor memories.

Generally, a non-abstract database representative of the system may be a database or other data structure that can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool that may synthesize the description to produce a netlist comprising a list of gates from a synthesis library. The netlist comprises a set of gates that also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, Alternatively, the database may itself be the netlist (with or without the synthesis library) or the data set.

Having described the invention, and a preferred embodiment thereof, what is claimed as new and secured by Letters Patent is:

1. A power converter having an input port and an output port, the power converter comprising:
    a controller to generate one or more control signals based, at least in part, on signals within the power converter;
    at least one switch to alternately transition between a conducting and a non-conducting state based, at least in part, on a gate-drive voltage to be applied to a gate of the at least one switch; and
    a level shifter comprising a memory, the level shifter to facilitate the transition of the at least one switch between the conducting and the non-conducting state based, at least in part, on a particular logical value to be selected from logical values to be stored in the memory of the level shifter, the particular logical value to be selected to generate the gate-drive voltage,
    wherein the level shifter comprises a first buffer on a first path and a second buffer on a second path and a multiplexer coupled to the first buffer on the first path and the second buffer on the second path, wherein at least one of the first and the second buffers buffer the particular logical value,
    wherein the particular logical value to comprise a value to be derived from a fast bit along the first path or the second path.

2. The power converter of claim 1, and further comprising a switching network to interconnect the at least one switch with a plurality of capacitors so as to alternately arrange the plurality of capacitors into a first and a second arrangement to convert a voltage at the input port into a voltage at the output port.

3. The power converter of claim 2, wherein the switching network to comprise the at least one switch.

4. The power converter of claim 2, and further comprising a regulator to be coupled to the switching network, the regulator to generate a magnetic field with an amplitude to depend, at least in part, on a rate at which charge enters the regulator changes with time.

5. The power converter of claim 4, wherein the regulator to comprise the at least one switch.

6. The power converter of claim 1, wherein the first and the second buffers to store the logical values, a first logical value of the logical values to be stored in the first buffer and a second logical value of the logical values to be stored in the second buffer, wherein the first buffer to be coupled to a non-inverting input of the multiplexer, and wherein the second buffer to be coupled to an inverting input of the multiplexer.

7. The power converter of claim 1, wherein the level shifter to select the particular logical value, to invert the particular logical value, and to generate the gate-drive voltage based, at least in part on the inverted logical value.

8. The power converter of claim 1, wherein the level shifter comprises a latch to store an indication regarding which logical value is to be selected to generate the gate-drive voltage.

9. The power converter of claim 1, wherein the level shifter comprises an output interface to receive a gate-drive signal from the level shifter and to derive, from the gate-drive signal, the gate-drive voltage to be applied to the gate, wherein a potential difference across the output interface is to be variable.

10. The power converter of claim 1, wherein the memory to comprise a first memory cell and at least a second memory cell to be cross-coupled with the first memory cell, the first memory cell to store a first logical value of the logical values and the second memory cell to store a second logical value of the logical values, and wherein, during operation of the power converter, a change in the first logical value to facilitate a change in the second logical value.

11. The power converter of claim 10 wherein the first logical value is to be complementary to the second logical value.

12. The power converter of claim 1, wherein the level shifter further comprises a delay which prevents the gate-drive voltage from changing during a blanking interval.

13. The power converter of claim 1, wherein the logical values are binary digits.

14. The power converter of claim 1, wherein the level shifter further comprises an input interface, the input interface to provide an instruction signal to the level shifter to form a conduction channel.

15. A power converter having an input port and an output port, the power converter comprising:
    a controller to generate one or more control signals based, at least in part, on signals within the power converter;
    at least one switch to alternately transition between a conducting and a non-conducting state based, at least in part, on a gate-drive voltage to be applied to a gate of the at least one switch; and
    a level shifter comprising a memory, the level shifter to facilitate the transition of the at least one switch between the conducting and the non-conducting state based, at least in part, on a particular logical value to be selected from logical values to be stored in the memory of the level shifter, the particular logical value to be selected to generate the gate-drive voltage,
    wherein the level shifter comprises a first buffer on a first path and a second buffer on a second path and a multiplexer coupled to the first buffer on the first path and the second buffers on the second path, wherein at least one of the first and the second buffers buffer the particular logical value, wherein the memory to comprise a first transistor and at least a second transistor to be cross-coupled with the first transistor, the first transistor to store a first logical value of the logical values and the second transistor to store a second logical value of the logical values, and wherein, during operation of the power converter, a change in the first logical value to facilitate a change in the second logical value.

16. The power converter of claim 15, and further comprising a switching network to interconnect the at least one switch with a plurality of capacitors so as to alternately arrange the plurality of capacitors into a first and a second arrangement to convert a voltage at the input port into a voltage at the output port.

17. The power converter of claim 16, wherein the switching network to comprise the at least one switch.

18. The power converter of claim 16, and further comprising a regulator to be coupled to the switching network, the regulator to generate a magnetic field with an amplitude to depend, at least in part, on a rate at which charge enters the regulator changes with time.

19. The power converter of claim 18, wherein the regulator to comprise the at least one switch.

20. The power converter of claim 15, wherein the first and the second buffers to store the logical values, a first logical value of the logical values to be stored in the first buffer and a second logical value of the logical values to be stored in the second buffer, wherein the first buffer to be coupled to a non-inverting input of the multiplexer, and wherein the second buffer to be coupled to an inverting input of the multiplexer.

21. The power converter of claim 15, wherein the level shifter to select the particular logical value, to invert the particular logical value, and to generate the gate-drive voltage based, at least in part on the inverted logical value.

22. The power converter of claim 15, wherein the particular logical value to comprise a value to be derived from a fast bit along the first path or the second path.

23. The power converter of claim 15, wherein the level shifter comprises a latch to store an indication regarding which logical value is to be selected to generate the gate-drive voltage.

24. The power converter of claim 15, wherein the level shifter comprises an output interface to receive a gate-drive signal from the level shifter and to derive, from the gate-drive signal, the gate-drive voltage to be applied to the gate, wherein a potential difference across the output interface is to be variable.

25. The power converter of claim 15 wherein the first logical value is to be complementary to the second logical value.

26. The power converter of claim 15, wherein the level shifter further comprises a delay which prevents the gate-drive voltage from changing during a blanking interval.

27. The power converter of claim 15, wherein the logical values are binary digits.

28. The power converter of claim 15, wherein the level shifter further comprises an input interface, the input interface to provide an instruction signal to the level shifter to form the conduction channel.

29. A power converter having an input port and an output port, the power converter comprising:
   a controller to generate one or more control signals based, at least in part, on signals within the power converter;
   at least one switch to alternately transition between a conducting and a non-conducting state based, at least in part, on a gate-drive voltage to be applied to a gate of the at least one switch; and
   a level shifter to control the at least one switch, wherein the level shifter is to store and select a first logical value that generates the gate-drive voltage in response to the one or more control signals, wherein a latch is to store information indicative of a preceding transition, wherein said level shifter comprises a delay that is to prevent said gate-drive voltage from changing until lapse of a blanking interval,
   wherein the level shifter further comprises a first path and a second path, the first path and the second path providing complementary transitions between the conducting and non-conducting states, wherein the level shifter selects the faster of the first path and the second path after each transition.

30. The power converter of claim 29, wherein the latch is a set/reset
   latch, wherein the set/reset latch prevents the information indicative of the preceding transition from changing during a predetermined amount of time after a transition.

* * * * *